(12) United States Patent
Kimura et al.

(10) Patent No.: US 9,929,717 B2
(45) Date of Patent: Mar. 27, 2018

(54) ELASTIC WAVE DEVICE

(71) Applicant: Murata Manufacturing Co., Ltd., Nagaokakyo-shi, Kyoto-fu (JP)

(72) Inventors: Tetsuya Kimura, Nagaokakyo (JP); Michio Kadota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 681 days.

(21) Appl. No.: 14/536,970

(22) Filed: Nov. 10, 2014

(65) Prior Publication Data

US 2015/0061466 A1 Mar. 5, 2015

Related U.S. Application Data

(63) Continuation of application No. PCT/JP2013/063254, filed on May 13, 2013.

(30) Foreign Application Priority Data

May 15, 2012 (JP) ................................. 2012-111702

(51) Int. Cl.
| | |
|---|---|
| *H01L 41/18* | (2006.01) |
| *H03H 9/17* | (2006.01) |
| *H03H 3/10* | (2006.01) |
| *H03H 9/02* | (2006.01) |
| *H01L 41/047* | (2006.01) |
| *H01L 41/187* | (2006.01) |
| *H03H 9/145* | (2006.01) |

(52) U.S. Cl.
CPC .............. *H03H 9/17* (2013.01); *H01L 41/047* (2013.01); *H01L 41/18* (2013.01); *H01L 41/1873* (2013.01); *H03H 3/10* (2013.01); *H03H 9/02228* (2013.01); *H03H 9/02559* (2013.01); *H03H 9/145* (2013.01)

(58) Field of Classification Search
CPC ........ H03H 9/17; H03H 9/2559; H01L 41/18; H01L 41/07
USPC ...... 310/313 A, 313 R, 313 B; 333/150–154, 333/193–196
See application file for complete search history.

(56) References Cited

U.S. PATENT DOCUMENTS 5,565,725 A * 10/1996 Nakahata ........... H03H 9/02582
310/313 A
6,445,265 B1 9/2002 Wright
(Continued)

FOREIGN PATENT DOCUMENTS

| CN | 101534105 A | 9/2009 |
|---|---|---|
| CN | 102217194 A | 10/2011 |

(Continued)

OTHER PUBLICATIONS

Official Communication issued in corresponding German Patent Application No. 112013002520.5, dated Aug. 1, 2016.
(Continued)

*Primary Examiner* — Thomas Dougherty
*Assistant Examiner* — Karen B Addison
(74) *Attorney, Agent, or Firm* — Keating & Bennett, LLP

(57) ABSTRACT

An elastic wave device includes a piezoelectric substrate and an interdigital transducer electrode disposed in a piezoelectric vibrating portion of the piezoelectric substrate to pass through the piezoelectric substrate.

8 Claims, 20 Drawing Sheets

(56) References Cited

U.S. PATENT DOCUMENTS

| | | | |
|---|---|---|---|
| 2002/0158708 A1* | 10/2002 | Inoue | H03H 9/0542 333/133 |
| 2005/0212612 A1* | 9/2005 | Kawakubo | H03H 9/542 331/117 R |
| 2006/0152107 A1 | 7/2006 | Tanaka | |
| 2007/0188047 A1 | 8/2007 | Tanaka | |
| 2008/0179989 A1 | 7/2008 | Ogami et al. | |
| 2009/0072659 A1* | 3/2009 | Nishiyama | H03H 9/02559 310/313 B |
| 2009/0231061 A1 | 9/2009 | Tanaka | |
| 2010/0123367 A1 | 5/2010 | Tai et al. | |
| 2011/0199168 A1 | 8/2011 | Kadota | |

FOREIGN PATENT DOCUMENTS

| | | |
|---|---|---|
| DE | 10 2009 046 875 A1 | 5/2010 |
| JP | 2002-152007 A | 5/2002 |
| JP | 2002-534886 A | 10/2002 |
| JP | 2006-217566 A | 8/2006 |
| JP | 2007-251910 A | 9/2007 |
| JP | 4613960 B2 | 1/2011 |
| JP | 2011-114397 A | 6/2011 |
| WO | 2007/046236 A1 | 4/2007 |

OTHER PUBLICATIONS

Official Communication issued in International Patent Application No. PCT/JP2013/063254, dated Jun. 25, 2013.

* cited by examiner

ELASTIC WAVE DEVICE

BACKGROUND OF THE INVENTION

1. Field of the Invention

The present invention relates to an elastic wave device that includes a piezoelectric substrate with a thickness equal to or less than a wavelength of a propagating elastic wave.

2. Description of the Related Art

Various elastic wave devices using a plate wave, such as a Lamb wave, have been proposed. By providing an interdigital transducer (IDT) electrode on a thin piezoelectric substrate, various elastic wave characteristics can be obtained using a plate wave. For example, Japanese Patent No. 4613960 describes a technique in which, by using the A1 mode, elastic wave characteristics of a high acoustic velocity of 10000 m/second or more can be achieved.

Japanese Unexamined Patent Application Publication No. 2002-152007 discloses an elastic wave device using the SH mode of a plate wave. Japanese Unexamined Patent Application Publication No. 2002-152007 states that wide-band characteristics can be achieved using the SH mode.

However, a conventional elastic wave device using a plate wave has a problem in that characteristics change significantly with changes in the thickness of the piezoelectric substrate or the electrode. Specifically, an electromechanical coupling coefficient (i.e., a bandwidth, an acoustic velocity, and a stop band) tends to change significantly when the thickness of the piezoelectric substrate or the electrode changes. This means that it has been difficult to stably manufacture elastic wave devices having desired characteristics.

To achieve a wide bandwidth, it is necessary to reduce the duty or the thickness of the IDT electrode. In this case, the effect of resistance loss of the electrode increases in a high frequency band, such as a GHz band. Therefore, the elastic wave device formed as a resonator has a problem of increased resonant resistance, and the elastic wave device formed as a filter has a problem of increased loss.

SUMMARY OF THE INVENTION

Preferred embodiments of the present invention provide an elastic wave device which is less prone to changes in characteristics due to changes in the thickness of a piezoelectric substrate or an electrode.

An elastic wave device according to a preferred embodiment of the present invention includes a piezoelectric substrate having a thickness equal to or less than a wavelength of a propagating elastic wave, and an IDT electrode. The IDT electrode passes through the piezoelectric substrate.

According to a specific aspect of the elastic wave device according to a preferred embodiment of the present invention, the piezoelectric substrate is made of $LiNbO_3$. This increases the fractional bandwidth.

According to another specific aspect of the elastic wave device according to a preferred embodiment of the present invention, an Euler angle θ of $LiNbO_3$ preferably is about 100° to about 140°, for example. In this case, the fractional bandwidth of a shear horizontal (SH) wave, which is a plate wave, is further increased.

According to another specific aspect of the elastic wave device according to a preferred embodiment of the present invention, a duty of the IDT electrode preferably is about 0.5 or less, for example. In this case, the fractional bandwidth of the SH wave, which is a plate wave, is further increased.

According to another specific aspect of the elastic wave device according to a preferred embodiment of the present invention, the IDT electrode is made primarily of a metal selected from a group consisting of Al, Cu, W, Au, Pt, Ta, Mo, and Ni. Since these metals have low electrical resistances, it is possible to reduce the resonant resistance or loss of the elastic wave device.

In the elastic wave device according to various preferred embodiments of the present invention, the IDT electrode passes through the piezoelectric substrate. Therefore, even when the thicknesses of the piezoelectric substrate and the electrode are varied, the resulting changes in fractional bandwidth and acoustic velocity are very little. This facilitates manufacture of an elastic wave device having desired characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will now be explained by describing various preferred embodiments of the present invention with reference to the drawings.

Figure 1:
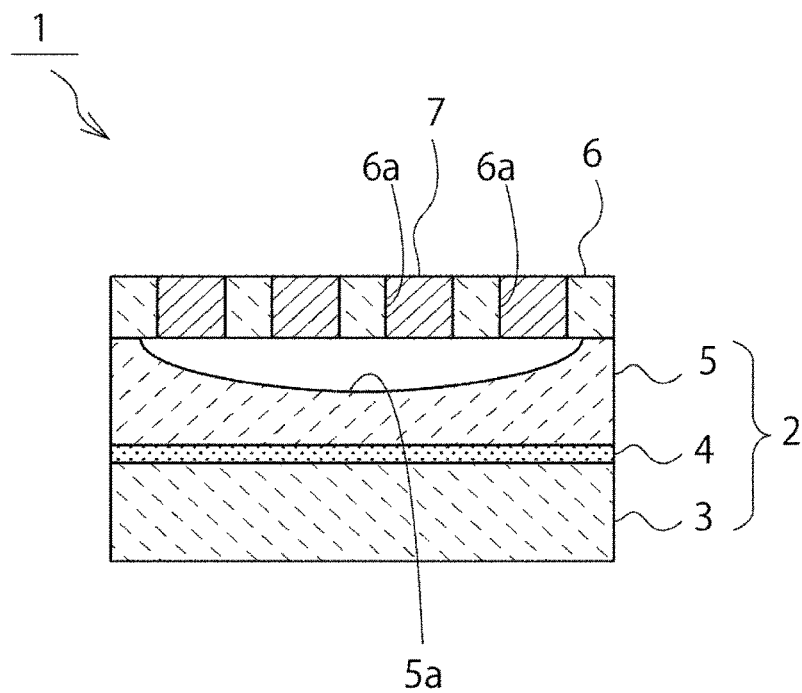
FIG. 1 is a front cross-sectional view of an elastic wave device according to a first preferred embodiment of the present invention.

FIG. 1 is a cross-sectional view of an elastic wave device according to a preferred embodiment of the present invention.

An elastic wave device 1 includes a supporting substrate 2. The supporting substrate 2 includes a base substrate 3, an adhesive layer 4 on the base substrate 3, and a supporting layer 5 on the adhesive layer 4. An upper surface of the supporting layer 5 includes a concave portion 5a. A piezoelectric substrate 6 is disposed on the supporting substrate 2 to face the concave portion 5a. The piezoelectric substrate 6 includes a plurality of through holes 6a passing therethrough from the upper surface to the lower surface thereof. The through holes 6a are filled with a metal material to define an IDT electrode 7. That is, the thickness of the IDT electrode 7 is preferably the same as that of the piezoelectric substrate 6.

As a material of the piezoelectric substrate 6, an appropriate piezoelectric material that is configured to excite a plate wave preferably is used. Examples of the piezoelectric material include LiNbO$_3$, LiTaO$_3$, and quartz crystal. In the present preferred embodiment, the piezoelectric substrate 6 preferably is made of LiNbO$_3$. In various preferred embodiments of the present invention, the piezoelectric substrate 6 may be a piezoelectric thin plate or a piezoelectric thin film formed by deposition, for example.

The IDT electrode 7 is preferably made of an appropriate metal material. Preferably, a metal selected from a group consisting of Al, Cu, W, Au, Pt, Ta, Mo, and Ni is used. Alternatively, the IDT electrode 7 may be a multilayer body including these metals. Since these metals have low electrical resistances, it is possible to reduce loss in the elastic wave device 1.

In the elastic wave device 1, the IDT electrode 7 passes through the piezoelectric substrate 6. Therefore, a plate wave is excited by exciting the IDT electrode 7. As described below, since the IDT electrode 7 passes through the piezoelectric substrate 6 in the elastic wave device 1 of the present preferred embodiment, characteristics, such as a fractional bandwidth, an acoustic velocity, and a stop band, do not easily change with changes in electrode thickness. Note that in the present preferred embodiment, a thickness h of the IDT electrode 7 preferably is the same or substantially the same as a thickness d of the piezoelectric substrate 6.

A portion of the piezoelectric substrate 6 where the IDT electrode 7 is provided defines a piezoelectric vibrating portion. The piezoelectric vibrating portion is acoustically isolated from the supporting substrate 2. Specifically, the concave portion 5a allows the piezoelectric vibrating portion to float above the supporting substrate 2.

The elastic wave device 1 of the present preferred embodiment was prepared preferably in the following manner, and the characteristics of the elastic wave device 1 were evaluated by varying the thickness h of the IDT electrode 7 and the thickness d of the piezoelectric substrate 6.

Figure 2:
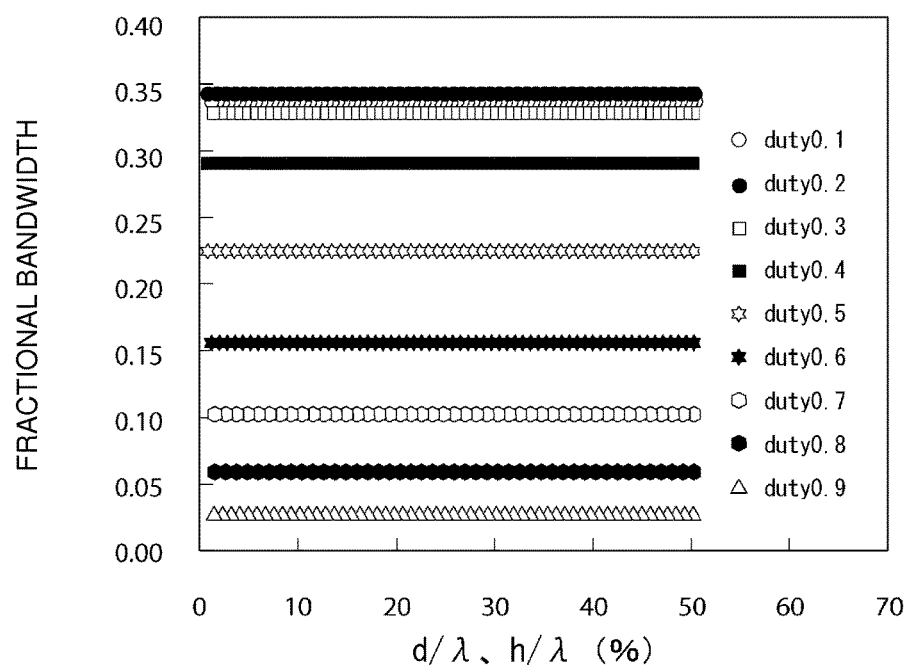
FIG. 2 shows a relationship between the thickness of a $LiNbO_3$ piezoelectric substrate with an Euler angle θ of about 120° and an electrode, the fractional bandwidth, and the duty.

In the following description, the thickness h of the IDT electrode 7 is expressed as a normalized thickness $h/\lambda$ obtained by normalizing the thickness h with a wavelength $\lambda$. Similarly, the thickness d of the piezoelectric substrate 6 is expressed as a normalized thickness $d/\lambda$ obtained by normalizing the thickness d with a wavelength $\lambda$. In FIG. 2 and the subsequent drawings, $d/\lambda$ and $h/\lambda$ are expressed in percentage.

The elastic wave device 1 prepared in the following experiment example is a one-port elastic wave resonator using a plate wave. A fractional bandwidth refers to a value obtained by normalizing the frequency range between a resonant frequency and an anti-resonant frequency of the one-port elastic wave resonator with the resonant frequency. As is well known, a fractional bandwidth is correlated with an electromechanical coupling coefficient. That is, a large fractional bandwidth corresponds to a large electromechanical coupling coefficient.

Also in the following description, an acoustic velocity refers to a phase velocity (m/second) corresponding to the resonant frequency of the one-port elastic wave resonator.

Also, a stop band refers to a stop band defined by electrode fingers of the one-port elastic wave resonator. As is well known, a stop band is correlated with a reflection coefficient of each electrode finger. That is, a large stop band corresponds to a large reflection coefficient.

In a non-limiting example of a preferred embodiment of the present invention, LiNbO$_3$ having Euler angles (0°, 120°, 0°) was used for the elastic wave device 1. Al was used as a material for forming the IDT electrode 7. The number of pairs of electrode fingers of the IDT electrode 7 was 50.

Figure 3:
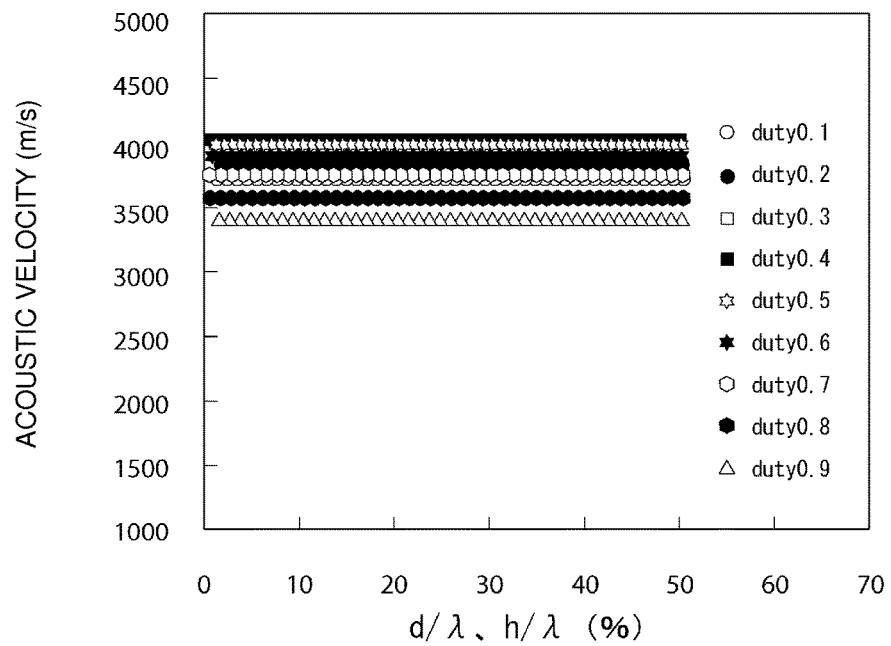
FIG. 3 shows a relationship between the thickness of the $LiNbO_3$ piezoelectric substrate with an Euler angle θ of about 120° and the electrode, the acoustic velocity, and the duty.
Figure 4:
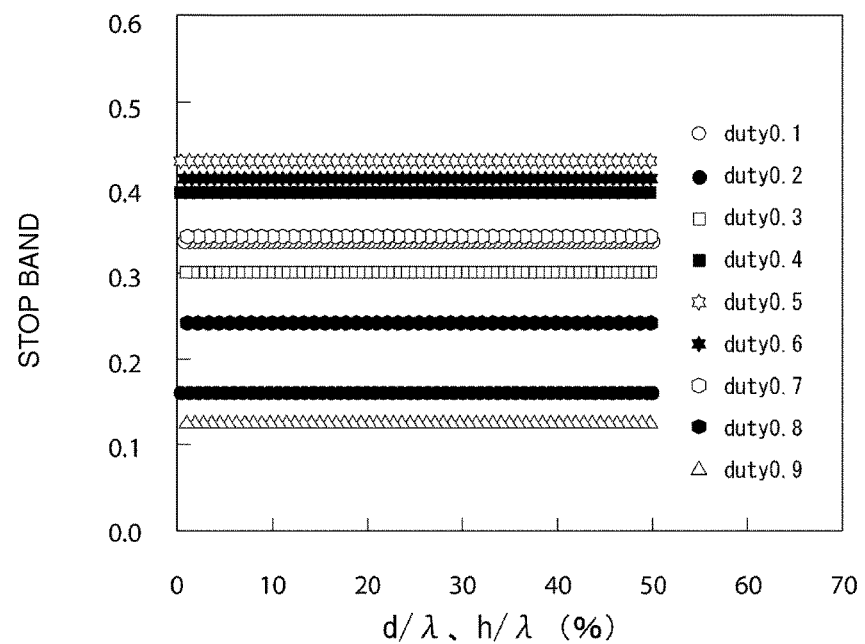
FIG. 4 shows a relationship between the thickness of the $LiNbO_3$ piezoelectric substrate with an Euler angle θ of about 120° and the electrode, the stop band, and the duty.

A plurality of different types of elastic wave devices 1 were prepared by varying the thickness $d/\lambda$ of the piezoelectric substrate 6=the thickness $h/\lambda$ of the IDT electrode 7 and the duty of the IDT electrode 7 in the elastic wave device 1 described above. FIGS. 2 to 4 are graphs showing relationships between the thickness $d/\lambda$ of the piezoelectric substrate 6 and the thickness $h/\lambda$ of the IDT electrode 7, the duty, the fractional bandwidth, the acoustic velocity, and the stop band in the plurality of elastic wave devices prepared as described above.

As can be seen in FIGS. 2 to 4, when the IDT electrode 7 made of Al is used, even though the thickness $d/\lambda$ of the piezoelectric substrate 6 and the thickness $h/\lambda$ of the IDT electrode 7 are changed to 50% regardless of the duty, there is virtually no change in fractional bandwidth, acoustic velocity, and stop band.

Figure 5:
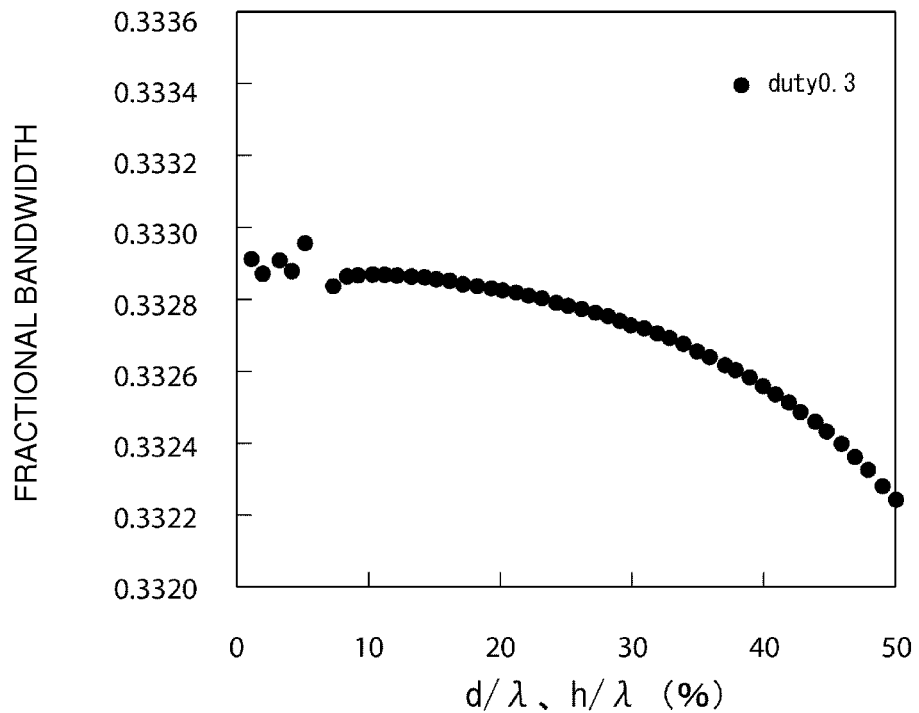
FIG. 5 shows a relationship between the fractional bandwidth and the thickness of the $LiNbO_3$ piezoelectric substrate with an Euler angle θ of about 120° and an IDT electrode with a duty of about 0.3.
Figure 6:
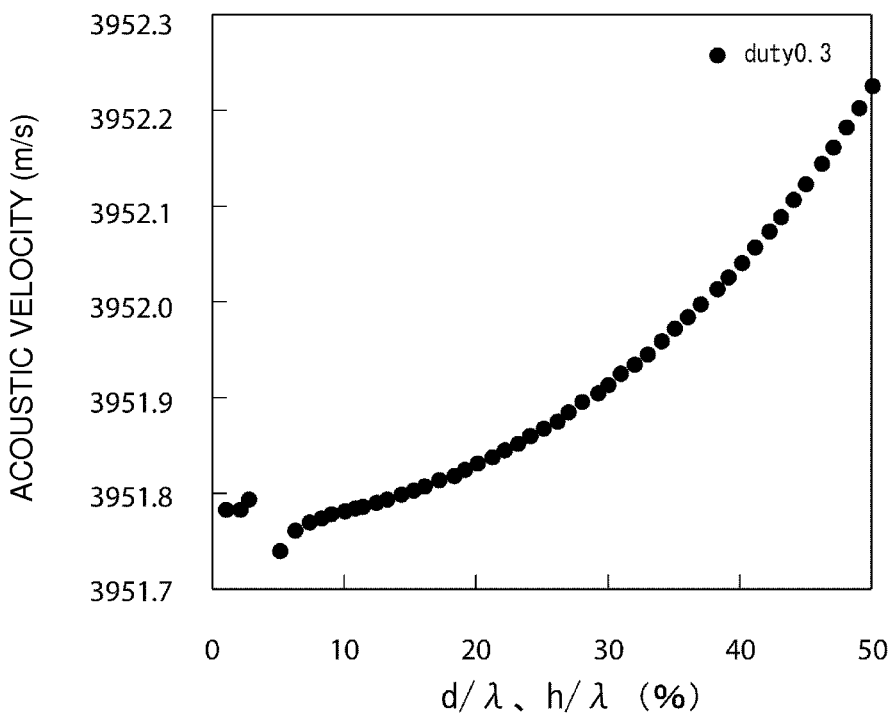
FIG. 6 shows a relationship between the acoustic velocity and the thickness of the $LiNbO_3$ piezoelectric substrate with an Euler angle θ of about 120° and the IDT electrode with a duty of about 0.3.
Figure 7:
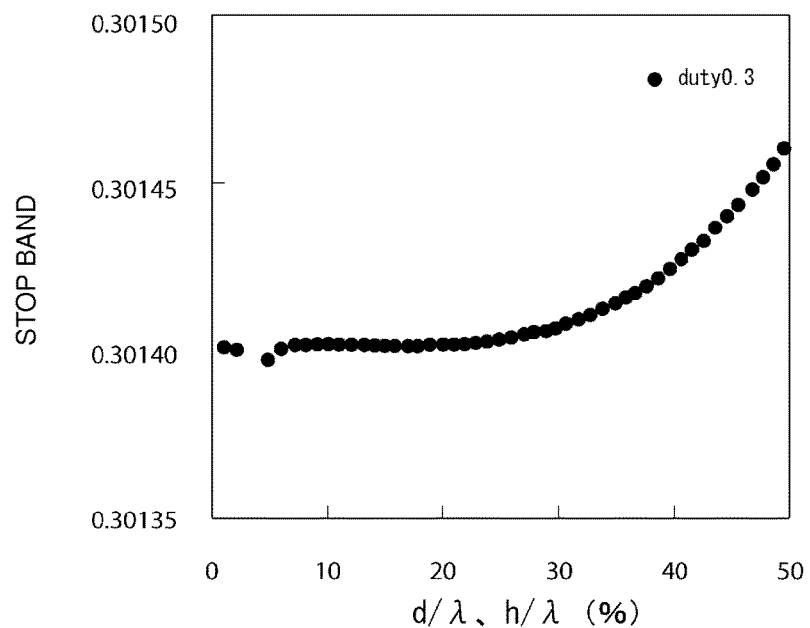
FIG. 7 shows a relationship between the stop band and the thickness of the $LiNbO_3$ piezoelectric substrate with an Euler angle θ of about 120° and the IDT electrode with a duty of about 0.3.

The fractional bandwidth, the acoustic velocity, and the stop band in FIGS. 2 to 4 seem unchanged with changes in the thickness $d/\lambda$ of the piezoelectric substrate 6 and the thickness $h/\lambda$ of the IDT electrode 7. However, the fractional bandwidth, the acoustic velocity, and the stop band actually change a little. FIGS. 5 to 7 are graphs showing the characteristics for the duty=0.3 in FIGS. 2 to 4. Note that the scale of the vertical axis is magnified in FIGS. 5 to 7. As can be seen in FIGS. 5 to 7, the fractional bandwidth tends to slightly decrease as the thickness $d/\lambda$ of the piezoelectric substrate 6 and the thickness $h/\lambda$ of the IDT electrode 7 increase toward 50%. On the other hand, the acoustic velocity slightly increases as the thickness $d/\lambda=h/\lambda$ increases. The stop band also increases as $d/\lambda=h/\lambda$ increases. In particular, when $d/\lambda=h/\lambda$ exceeds about 30%, the stop band widens significantly. However, as long as $d/\lambda=h/\lambda$ is about 30% or less, the width of the stop band changes very little with changes in $d/\lambda=h/\lambda$.

As described above, FIGS. 5 to 7 are magnified views of the characteristics for the duty=0.3 in FIGS. 2 to 4. In practice, as illustrated in FIGS. 2 to 4, even when $d/\lambda=h/\lambda$ changes, there is virtually no change in fractional bandwidth, acoustic velocity, and stop band.

Therefore, even if $d/\lambda=h/\lambda$ varies to some extent during manufacture, it is possible to manufacture the elastic wave device 1 having stable characteristics. In other words, it is possible to widen the manufacturing tolerance.

Figure 8:
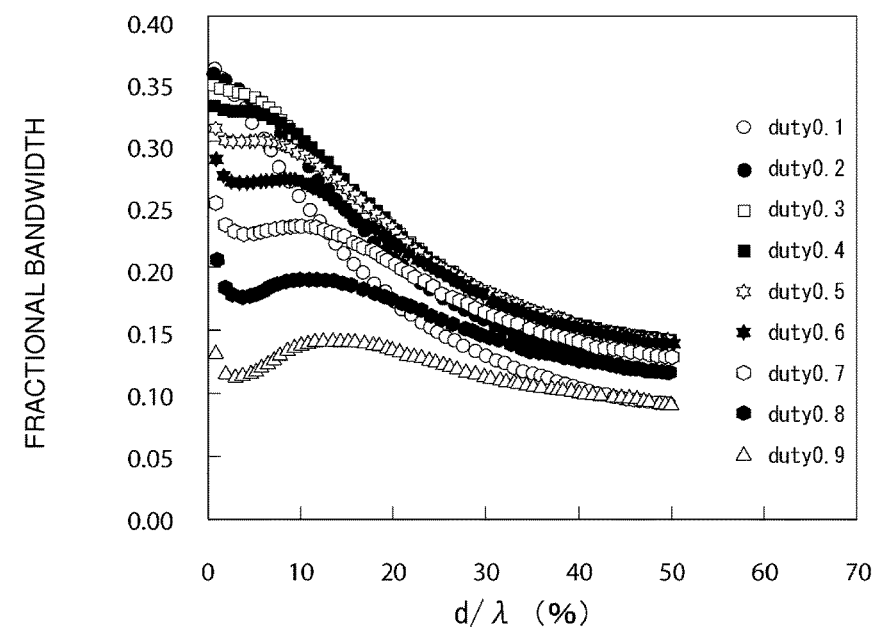
FIG. 8 shows a relationship between the thickness of the piezoelectric substrate, the duty, and the fractional bandwidth in an elastic wave device of a comparative example.
Figure 9:
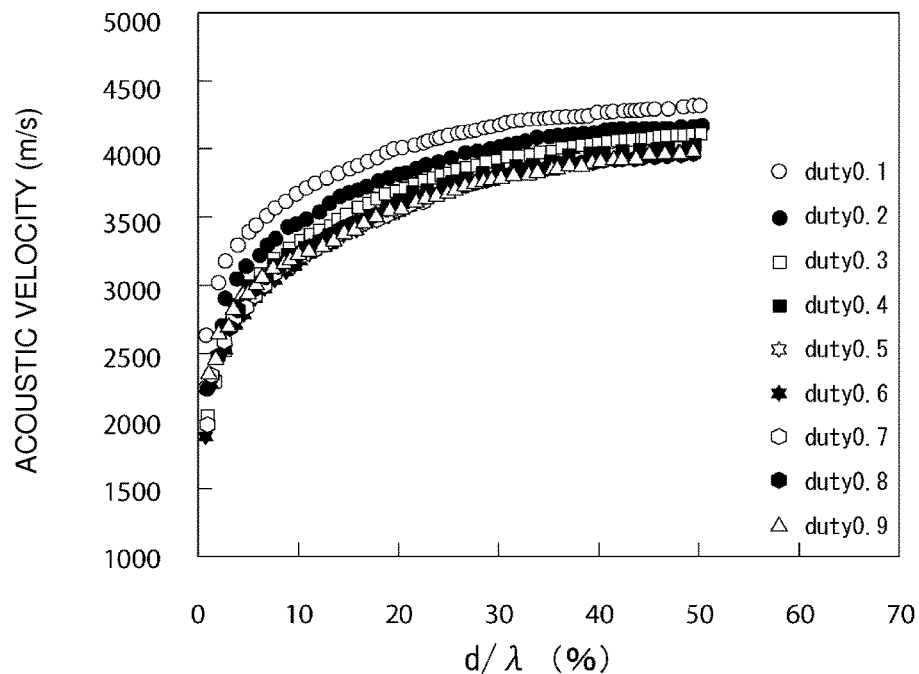
FIG. 9 shows a relationship between the thickness of the piezoelectric substrate, the duty, and the acoustic velocity in the elastic wave device of the comparative example.
Figure 10:
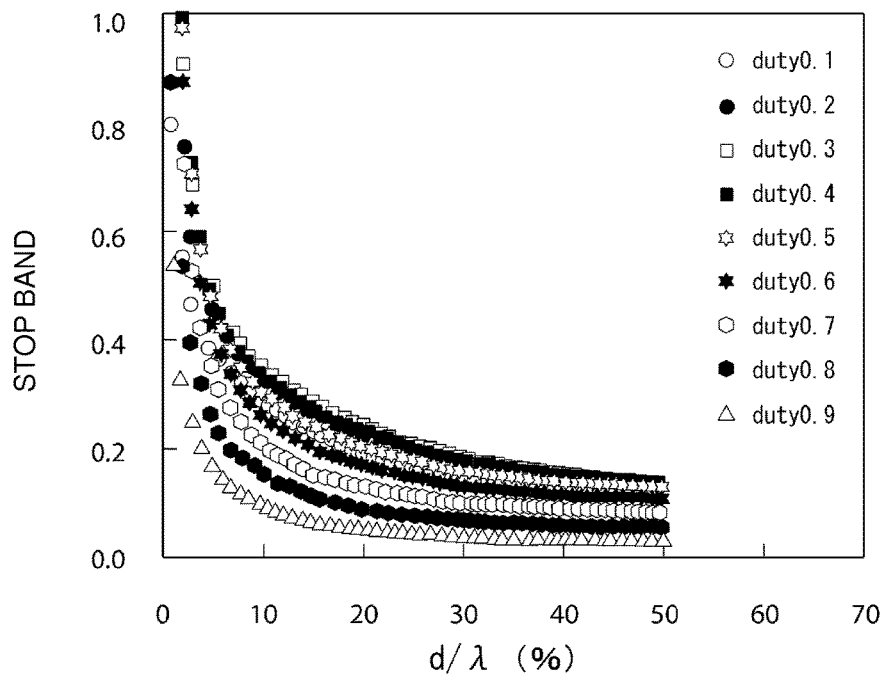
FIG. 10 shows a relationship between the thickness of the piezoelectric substrate, the duty, and the stop band in the elastic wave device of the comparative example.

FIGS. 8 to 10 show changes in fractional bandwidth, acoustic velocity, and stop band with changes in the thickness of a piezoelectric substrate in a conventional elastic wave device prepared for the purpose of comparison. An IDT electrode made of Al and having a thickness of about 0.06$\lambda$ (6%) was formed on the piezoelectric substrate. The other configuration is the same as that of the present preferred embodiment described above.

As can be seen in FIGS. 8 to 10, the fractional bandwidth, the acoustic velocity, and the stop band change significantly with changes in the thickness $d/\lambda$ of the piezoelectric substrate when the duty is any of about 0.1 to about 0.9.

Figure 11:
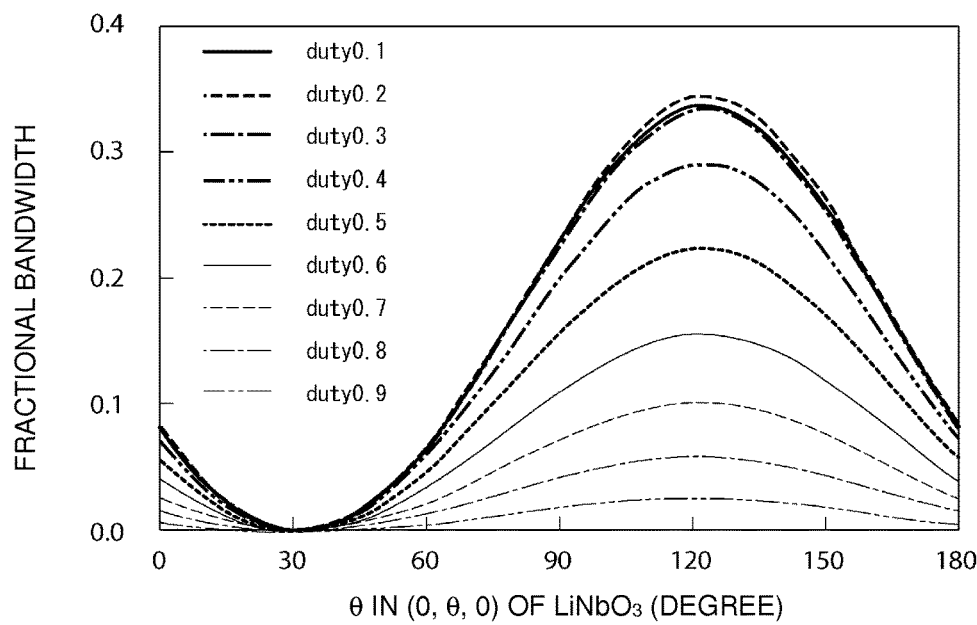
FIG. 11 shows a relationship between the Euler angle θ of $LiNbO_3$, the duty, and the fractional bandwidth in the first preferred embodiment of the present invention.

Next, changes in characteristic were examined when $\theta$ in the Euler angles ($\varphi$, $\theta$, $\psi$) of LiNbO$_3$ in the elastic wave device 1 of the present preferred embodiment was varied. FIG. 11 shows the result. As shown, $\theta$ in the Euler angles (0°, $\theta$, 0°) of LiNbO$_3$ was varied. The thickness $d/\lambda$ of LiNbO$_3$ was about 10%, and the thickness $h/\lambda$ of the IDT electrode 7 made of Al was also about 10%. The duty of the IDT electrode 7 was changed from about 0.1 to about 0.9.

As can be seen in FIG. 11, the fractional bandwidth is largest when the Euler angle $\theta$ is around 120°. FIG. 11 shows that the fractional bandwidth can be particularly increased when the Euler angle $\theta$ is about 90° to about 150°. The fractional bandwidth is increased to about 0.2 or more when the Euler angle $\theta$ is about 100° to about 140° and the duty is about 0.5 or less, for example.

Therefore, it is preferable that the Euler angle $\theta$ be in the following range (0°±5°, 90° to 150°, 0°±5°). It is more preferable that the Euler angles be in this range and the duty be about 0.5 or less.

As described above, in the elastic wave device of the comparative example, the characteristics change significantly with changes in the thickness of the piezoelectric substrate. In particular, the fractional bandwidth decreases as the thickness of the piezoelectric substrate increases. To achieve wide-band characteristics, the thickness of the piezoelectric substrate needs to be significantly reduced or minimized. However, reducing the thickness of the piezoelectric substrate makes the piezoelectric substrate more prone to breakage in the manufacturing process or during use. This makes it difficult to achieve the practical use.

In the comparative example, reducing the thickness of the piezoelectric substrate lowers the acoustic velocity. Therefore, to achieve desired frequency characteristics, it is necessary to narrow the electrode finger pitch of the IDT electrode. This requires a high-precision technique to make the IDT electrode, and may result in a lower ratio of non-defective products or a higher cost. Additionally, the IDT electrode may be damaged by external application of power or static electricity.

However, in the preferred embodiment described above, the characteristics change very little even when the thickness d/λ of the piezoelectric substrate 6 and the thickness h/λ of the IDT electrode 7 change. This facilitates manufacture and makes it easy to achieve higher frequencies.

In the elastic wave device of the comparative example, the characteristics change significantly with changes in not only the thickness of the piezoelectric substrate but also the thickness of the IDT electrode. This is conventionally known. In particular, as the electrode thickness increases, the acoustic velocity of the plate wave tends to decrease. Also, as the electrode thickness increases, the resistance loss of the electrode fingers decreases. Therefore, although the resonance characteristics are improved, the wavelength decreases due to a decrease in acoustic velocity. In the comparative example, even when the normalized thickness h/λ of the electrode is increased, the thickness and the width of the electrode do not increase in practice. Therefore, it is difficult to improve the characteristics of the elastic wave device of the comparative example. Additionally, a decrease in acoustic velocity leads to an increased manufacturing cost as described above. Also, the elastic wave device becomes susceptible to static electricity externally applied thereto.

The IDT electrode 7 is preferably made of Al in the preferred embodiment described above. In various preferred embodiments of the present invention, various metal materials may be used to form the IDT electrode 7 as described above. The following description will show that even when the electrode material is a metal other than Al, the characteristics change very little with changes in the thickness d/λ of the piezoelectric substrate 6 and the thickness h/λ of the IDT electrode 7, as in the preferred embodiment described above.

Figure 12:
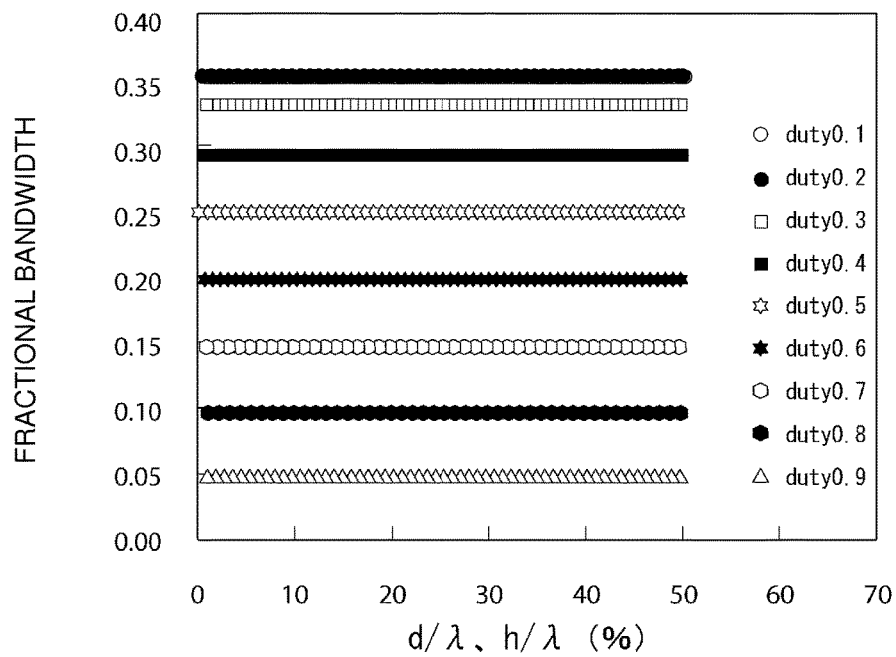
FIG. 12 shows a relationship between the thickness of an IDT electrode made of Cu and the piezoelectric substrate, the duty, and the fractional bandwidth in a preferred embodiment of the present invention.
Figure 13:
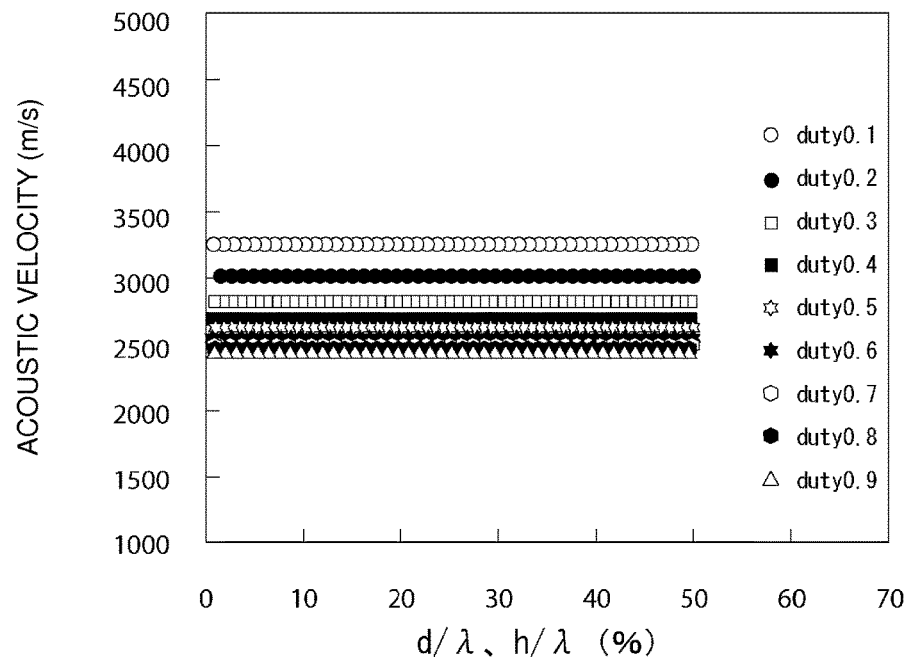
FIG. 13 shows a relationship between the thickness of the IDT electrode made of Cu and the piezoelectric substrate, the duty, and the acoustic velocity in a preferred embodiment of the present invention.

In another non-limiting example of a preferred embodiment of the present invention, the IDT electrode 7 preferably was made of Cu. The other points were the same as those of the preferred embodiment described above. FIGS. 12 and 13 show relationships between the thickness d/λ of the piezoelectric substrate 6=the electrode thickness h/λ, the duty, the fractional bandwidth, and the acoustic velocity in an elastic wave device configured in the same manner as the preferred embodiment described above, except that the IDT electrode 7 is made of Cu.

As can be seen in FIGS. 12 and 13, even when the IDT electrode is made of Cu, the fractional bandwidth and the acoustic velocity change very little with changes in the thickness d/λ of the piezoelectric substrate 6 and the electrode thickness h/λ.

Figure 14:
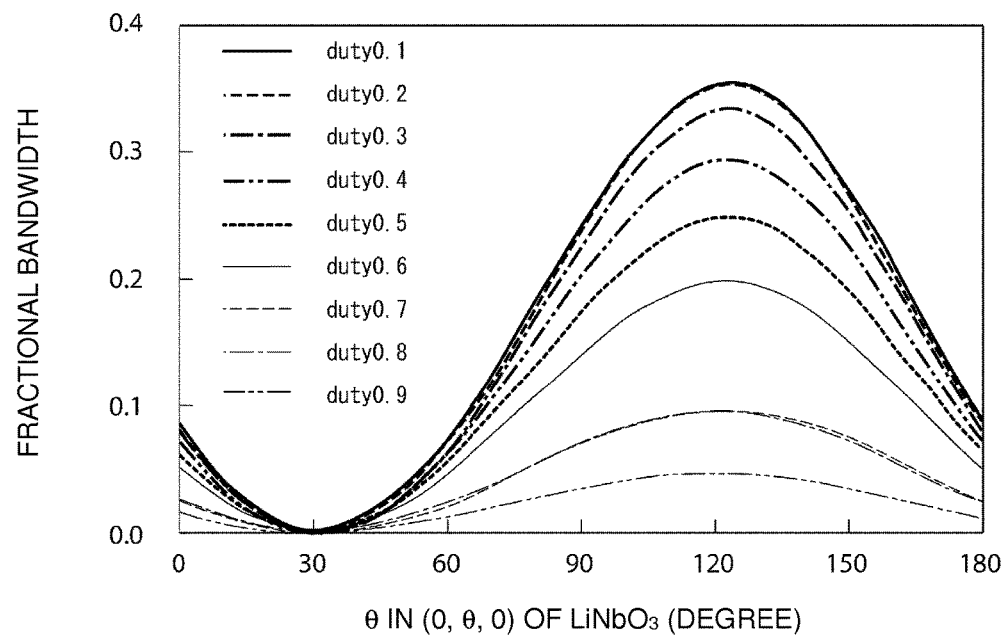
FIG. 14 shows a relationship between the Euler angle θ of LiNbO$_3$, the duty, and the fractional bandwidth in the case of using the IDT electrode made of Cu.

FIG. 14 shows a relationship between the varying Euler angle θ of LiNbO$_3$ and the fractional bandwidth in the case of d/λ=h/λ=0.1λ (10%). As can be seen in FIG. 14, even when the IDT electrode 7 is made of Cu, the fractional bandwidth can be effectively increased, as in the case of FIG. 11, when the Euler angle θ is about 100° to about 140°, for example. When θ is in this range and the duty is 0.5 or less, the fractional bandwidth can be 0.2 or more.

Figure 15:
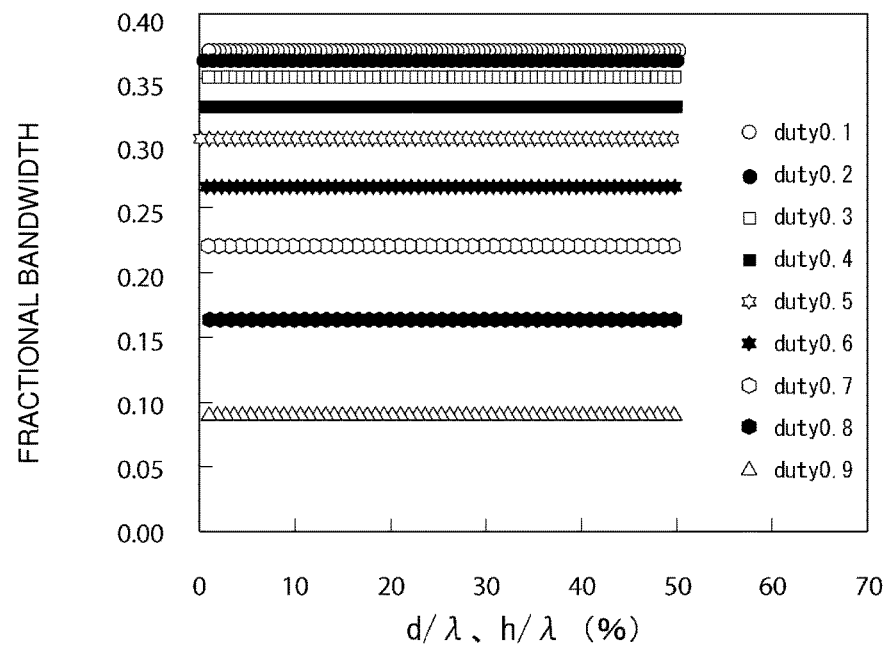
FIG. 15 shows a relationship between the thickness of an IDT electrode made of W and the piezoelectric substrate, the duty, and the fractional bandwidth in a preferred embodiment of the present invention.
Figure 16:
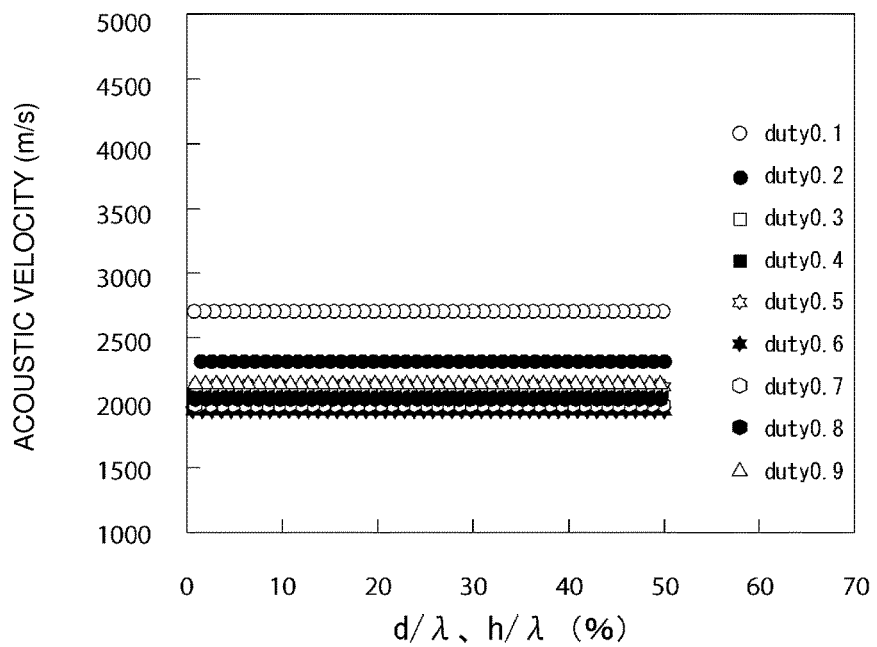
FIG. 16 shows a relationship between the thickness of the IDT electrode made of W and the piezoelectric substrate, the duty, and the acoustic velocity in a preferred embodiment of the present invention.

In another non-limiting example of a preferred embodiment of the present invention, the IDT electrode 7 was made of W. The other points were the same as those of the preferred embodiment described above. FIGS. 15 and 16 show relationships between the thickness d/λ of the piezoelectric substrate 6=the electrode thickness h/λ, the duty, the fractional bandwidth, and the acoustic velocity in an elastic wave device configured in the same manner as the preferred embodiment described above, except that the IDT electrode 7 is made of W.

As can be seen in FIGS. 15 and 16, even when the IDT electrode is made of W, the fractional bandwidth and the acoustic velocity change very little with changes in the thickness d/λ of the piezoelectric substrate 6 and the electrode thickness h/λ.

Figure 17:
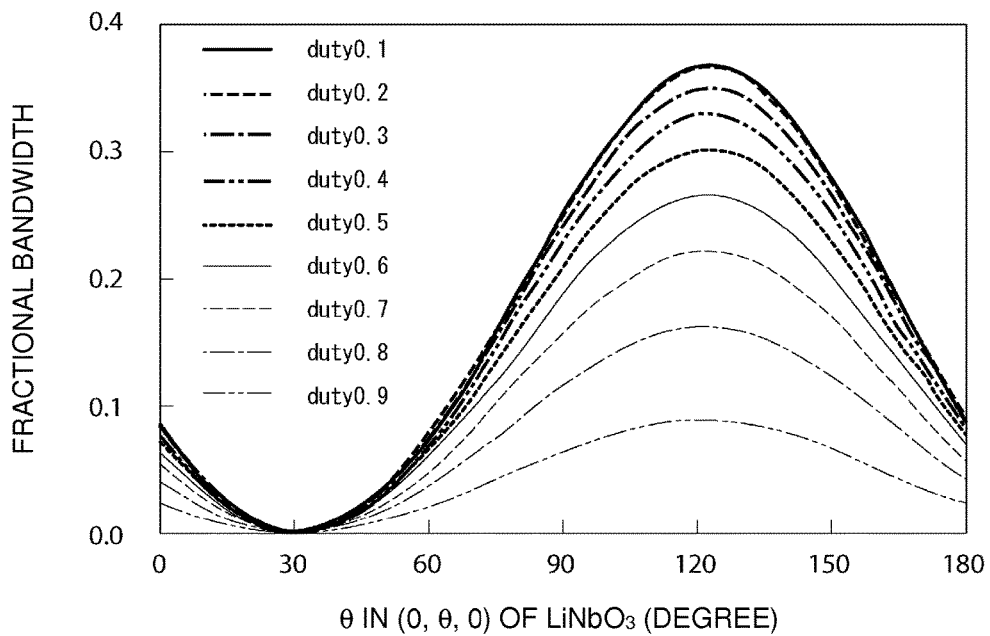
FIG. 17 shows a relationship between the Euler angle θ of LiNbO$_3$, the duty, and the fractional bandwidth in the case of using the IDT electrode made of W.

FIG. 17 shows a relationship between the varying Euler angle θ of LiNbO$_3$ and the fractional bandwidth in the case of d/λ=h/λ=0.1λ. As can be seen in FIG. 17, even when the IDT electrode 7 is made of W, the fractional bandwidth is effectively increased, as in the case of FIG. 11, when the Euler angle θ is about 90° to about 150°, for example. When θ is in this range and the duty is about 0.5 or less, the fractional bandwidth is about 0.2 or more, for example.

Figure 18:
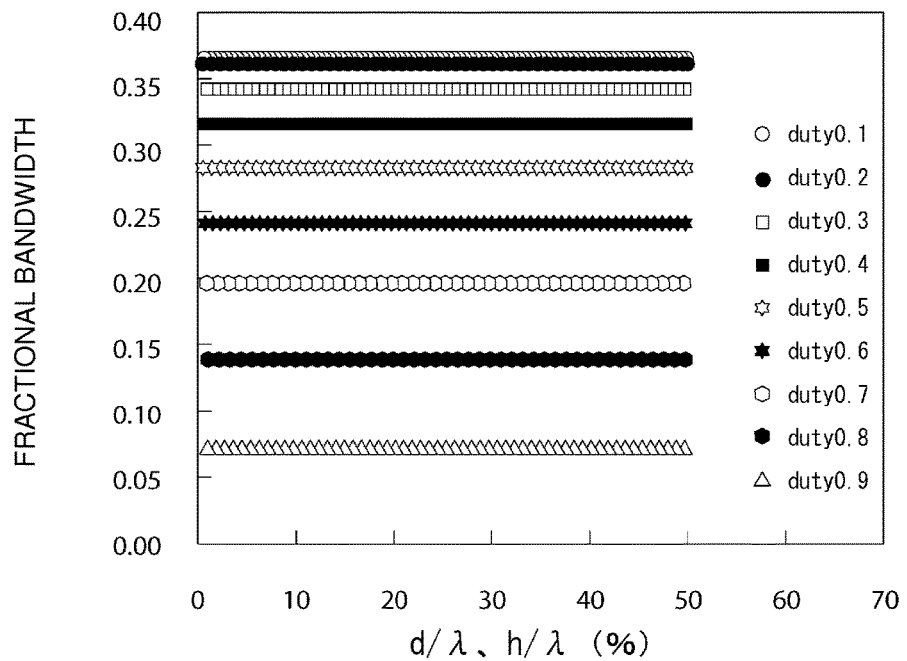
FIG. 18 shows a relationship between the thickness of an IDT electrode made of Ta and the piezoelectric substrate, the duty, and the fractional bandwidth in a preferred embodiment of the present invention.
Figure 19:
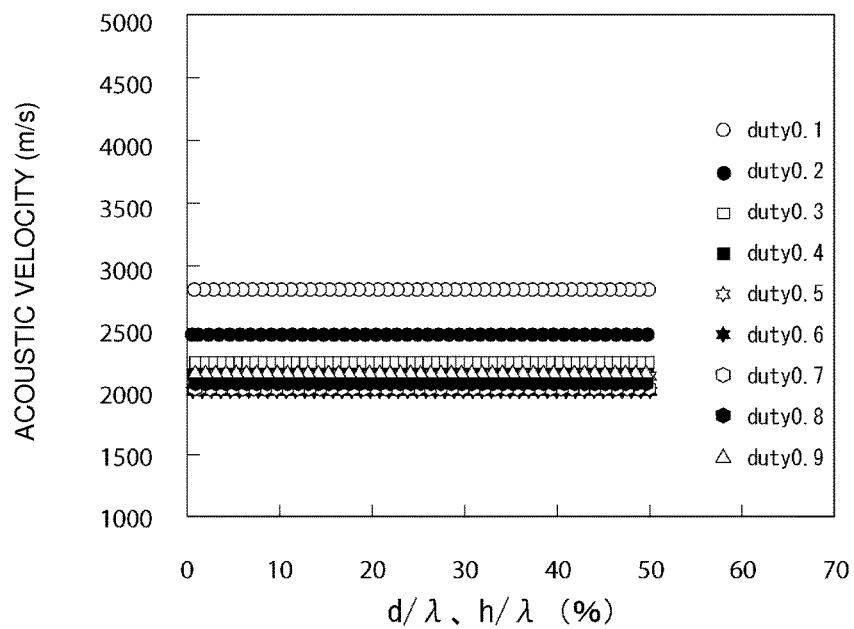
FIG. 19 shows a relationship between the thickness of the IDT electrode made of Ta and the piezoelectric substrate, the duty, and the acoustic velocity in a preferred embodiment of the present invention.

In another non-limiting example of a preferred embodiment of the present invention, the IDT electrode 7 was made of Ta. The other points were the same as those of the preferred embodiment described above. FIGS. 18 and 19 show relationships between the thickness d/λ of the piezoelectric substrate 6=the electrode thickness h/λ, the duty, the fractional bandwidth, and the acoustic velocity in an elastic wave device configured in the same manner as the preferred embodiment described above, except that the IDT electrode 7 is made of Ta.

As can be seen in FIGS. 18 and 19, even when the IDT electrode is made of Ta, the fractional bandwidth and the acoustic velocity change very little with changes in the thickness d/λ of the piezoelectric substrate 6 and the electrode thickness h/λ.

Figure 20:
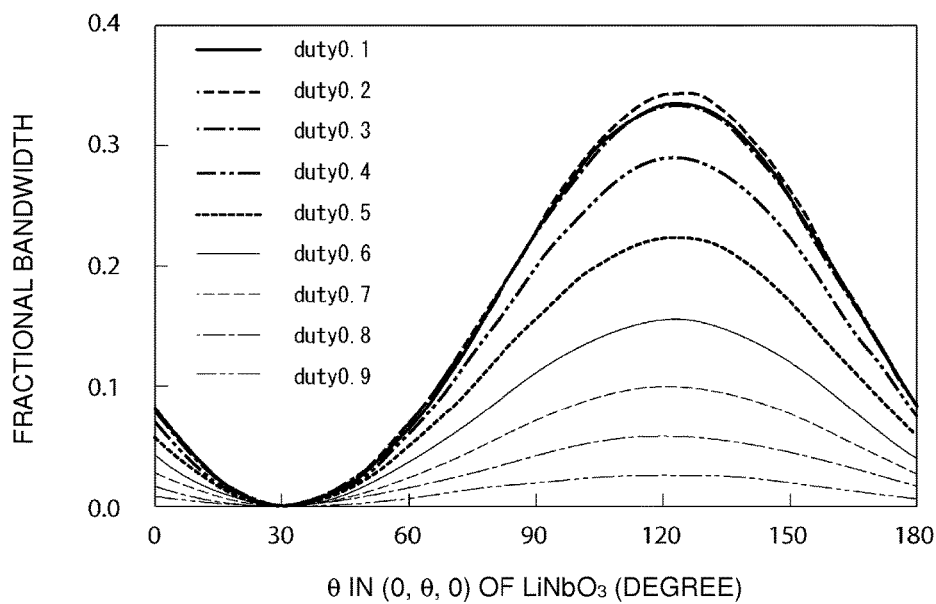
FIG. 20 shows a relationship between the Euler angle θ of LiNbO$_3$, the duty, and the fractional bandwidth in the case of using the IDT electrode made of Ta.

FIG. 20 shows a relationship between the varying Euler angle θ of LiNbO$_3$ and the fractional bandwidth in the case of d/λ=h/λ=10% (0.1λ). As can be seen in FIG. 20, even when the IDT electrode 7 is made of Ta, the fractional bandwidth is effectively increased, as in the case of FIG. 11, when the Euler angle θ is about 100° to about 140°, for example. When θ is in this range and the duty is about 0.5 or less, the fractional bandwidth is about 0.2 or more, for example.

Figure 21:
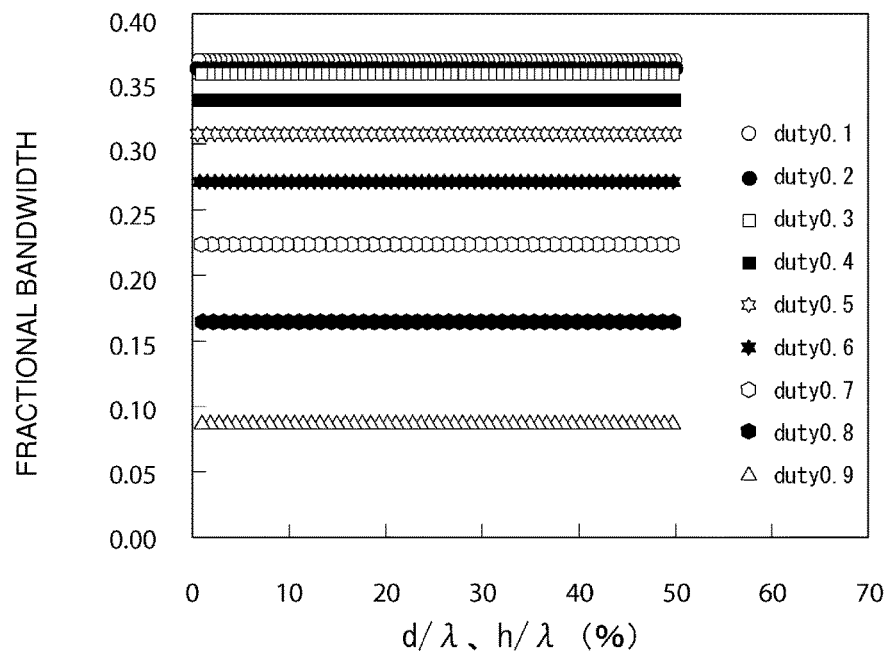
FIG. 21 shows a relationship between the thickness of an IDT electrode made of Mo and the piezoelectric substrate, the duty, and the fractional bandwidth in a preferred embodiment of the present invention.
Figure 22:
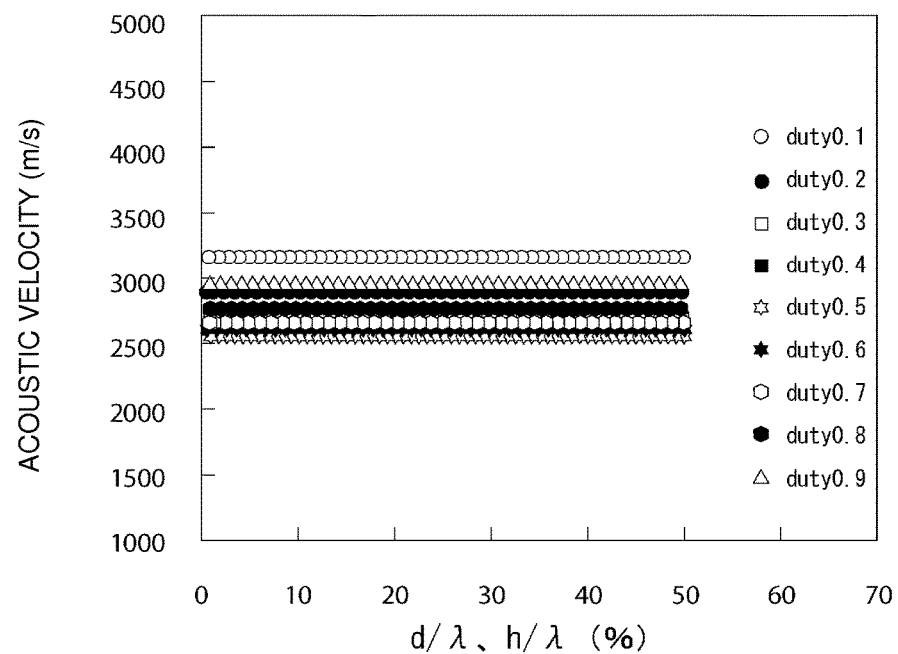
FIG. 22 shows a relationship between the thickness of the IDT electrode made of Mo and the piezoelectric substrate, the duty, and the acoustic velocity in a preferred embodiment of the present invention.

In another non-limiting example of a preferred embodiment of the present invention, the IDT electrode 7 was made of Mo. The other points were the same as those of the preferred embodiment described above. FIGS. 21 and 22 show relationships between the thickness d/λ of the piezoelectric substrate 6=the electrode thickness h/λ, the duty, the fractional bandwidth, and the acoustic velocity in an elastic wave device configured in the same manner as the preferred embodiment described above, except that the IDT electrode 7 is made of Mo.

As can be seen in FIGS. 21 and 22, even when the IDT electrode is made of Mo, the fractional bandwidth and the acoustic velocity change very little with changes in the thickness d/λ of the piezoelectric substrate 6 and the electrode thickness h/λ.

Figure 23:
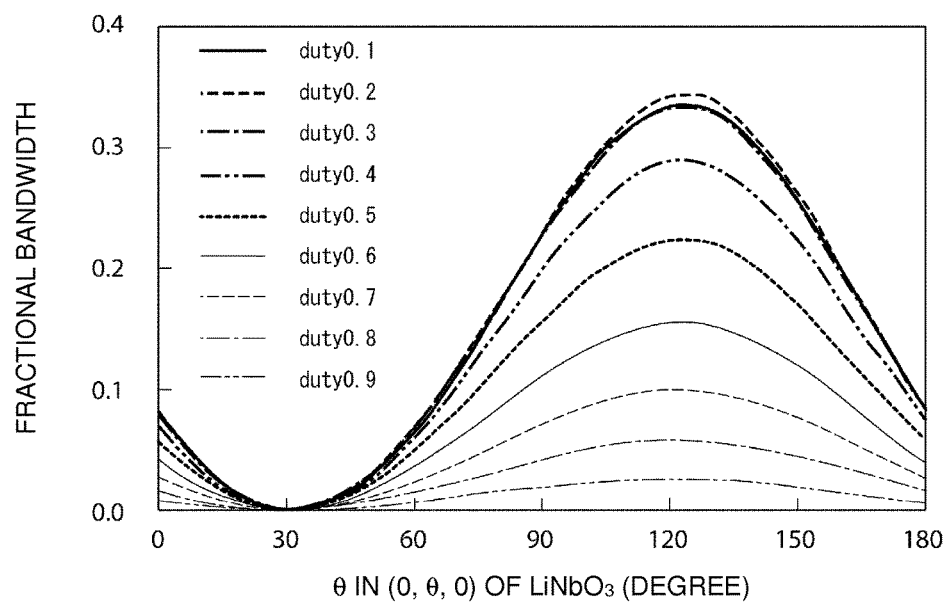
FIG. 23 shows a relationship between the Euler angle θ of LiNbO$_3$, the duty, and the fractional bandwidth in the case of using the IDT electrode made of Mo.

FIG. 23 shows a relationship between the varying Euler angle θ of LiNbO$_3$ and the fractional bandwidth in the case of d/λ=h/λ=about 10% (about 0.1λ). As can be seen in FIG. 23, even when the IDT electrode 7 is made of Mo, the fractional bandwidth is effectively increased, as in the case of FIG. 11, when the Euler angle θ is about 100° to about 140°. When θ is in this range and the duty is about 0.5 or less, the fractional bandwidth is about 0.2 or more.

Figure 24:
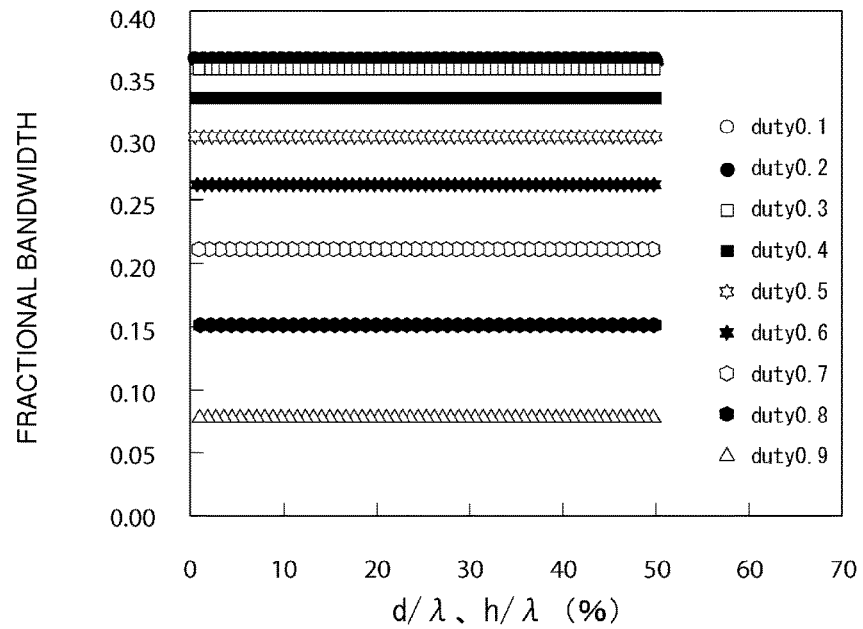
FIG. 24 shows a relationship between the thickness of an IDT electrode made of Ni and the piezoelectric substrate, the duty, and the fractional bandwidth in a preferred embodiment of the present invention.
Figure 25:
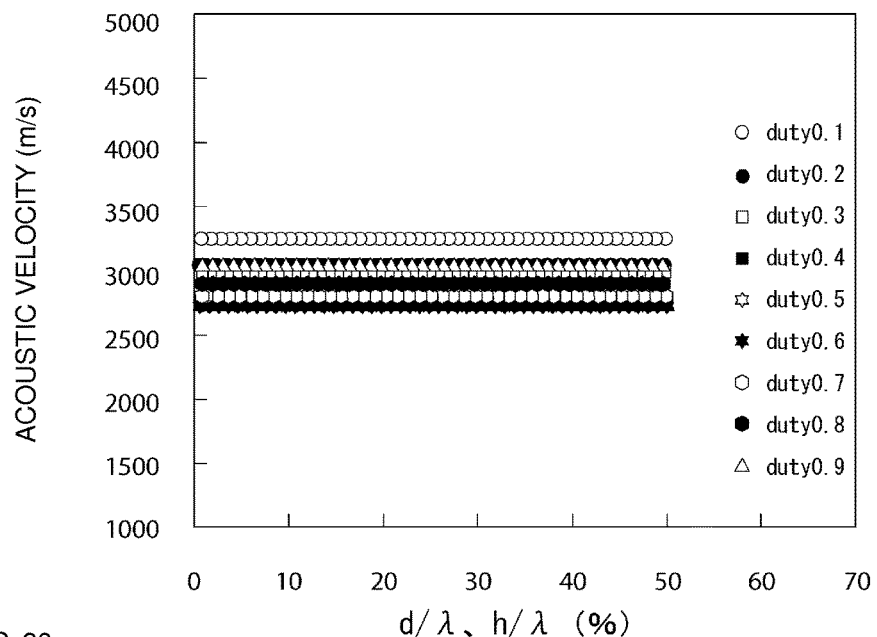
FIG. 25 shows a relationship between the thickness of the IDT electrode made of Ni and the piezoelectric substrate, the duty, and the acoustic velocity in a preferred embodiment of the present invention.

In another non-limiting example of a preferred embodiment of the present invention, the IDT electrode 7 was made of Ni. The other points were the same as those of the preferred embodiment described above. FIGS. 24 and 25 show relationships between the thickness d/λ of the piezoelectric substrate 6=the electrode thickness h/λ, the duty, the fractional bandwidth, and the acoustic velocity in an elastic wave device configured in the same manner as the preferred embodiment described above, except that the IDT electrode 7 is made of Ni.

As can be seen in FIGS. 24 and 25, even when the IDT electrode is made of Ni, the fractional bandwidth and the acoustic velocity change very little with changes in the thickness d/λ of the piezoelectric substrate 6 and the electrode thickness h/λ.

Figure 26:
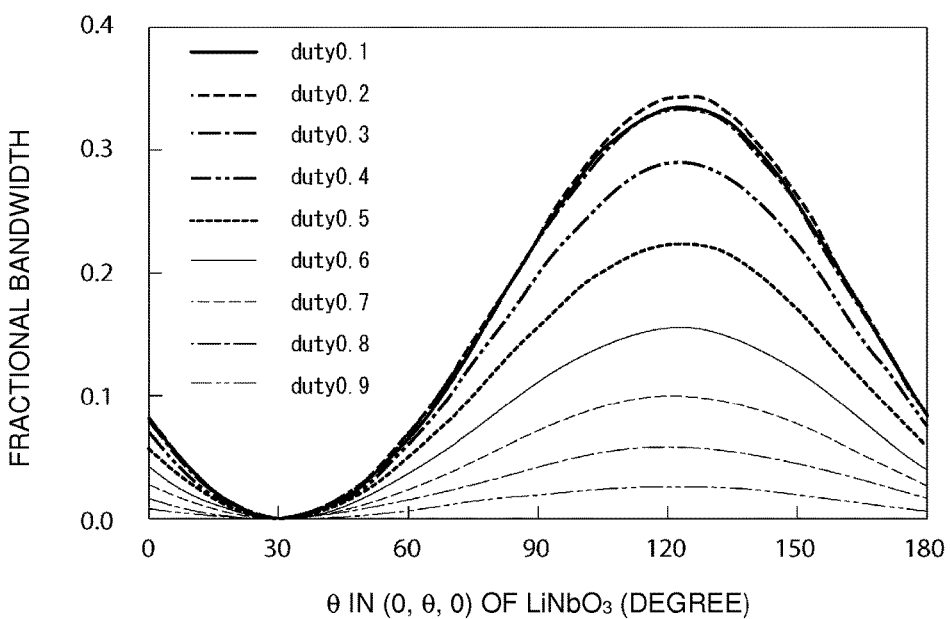
FIG. 26 shows a relationship between the Euler angle θ of LiNbO$_3$, the duty, and the fractional bandwidth in the case of using the IDT electrode made of Ni.

FIG. 26 shows a relationship between the varying Euler angle θ of LiNbO$_3$ and the fractional bandwidth in the case of d/λ=h/λ=about 10% (about 0.1λ). As can be seen in FIG. 26, even when the IDT electrode 7 is made of Ni, the fractional bandwidth is effectively increased, as in the case of FIG. 11, when the Euler angle θ is about 100° to about 140°, for example. When θ is in this range and the duty is about 0.5 or less, the fractional bandwidth is about 0.2 or more, for example.

Figure 27:
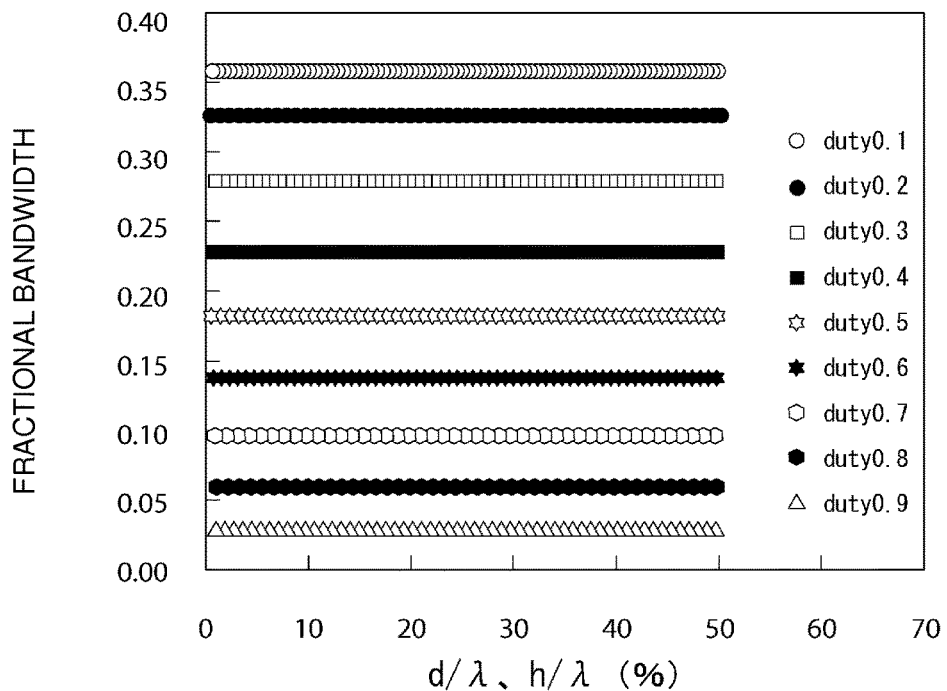
FIG. 27 shows a relationship between the thickness of an IDT electrode made of Au and the piezoelectric substrate, the duty, and the fractional bandwidth in a preferred embodiment of the present invention.
Figure 28:
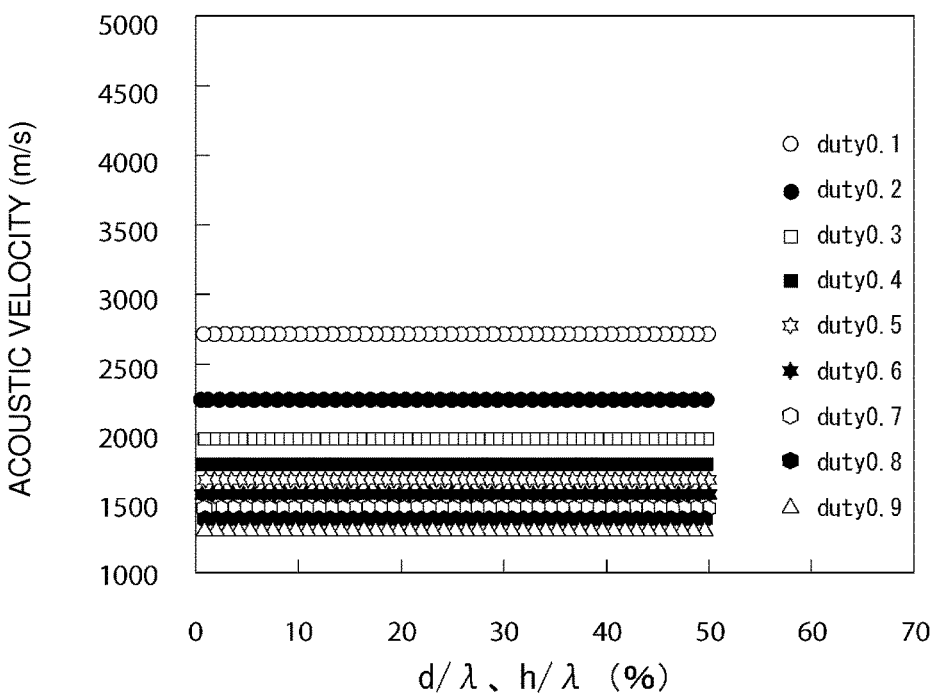
FIG. 28 shows a relationship between the thickness of the IDT electrode made of Au and the piezoelectric substrate, the duty, and the acoustic velocity in a preferred embodiment of the present invention.

In another non-limiting example of a preferred embodiment of the present invention, the IDT electrode 7 was made of Au. The other points were the same as those of the preferred embodiment described above. FIGS. 27 and 28 show relationships between the thickness d/λ of the piezoelectric substrate 6=the electrode thickness h/λ, the duty, the fractional bandwidth, and the acoustic velocity in an elastic wave device configured in the same manner as the preferred embodiment described above, except that the IDT electrode 7 is made of Au.

As can be seen in FIGS. 27 and 28, even when the IDT electrode is made of Au, the fractional bandwidth and the acoustic velocity change very little with changes in the thickness d/λ of the piezoelectric substrate 6 and the electrode thickness h/λ.

Figure 29:
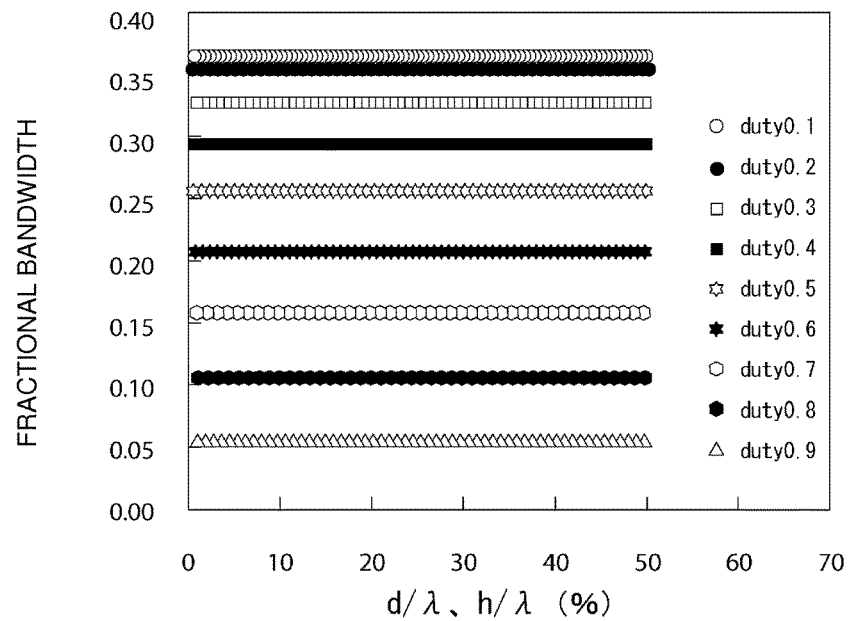
FIG. 29 shows a relationship between the thickness of an IDT electrode made of Pt and the piezoelectric substrate, the duty, and the fractional bandwidth in a preferred embodiment of the present invention.
Figure 30:
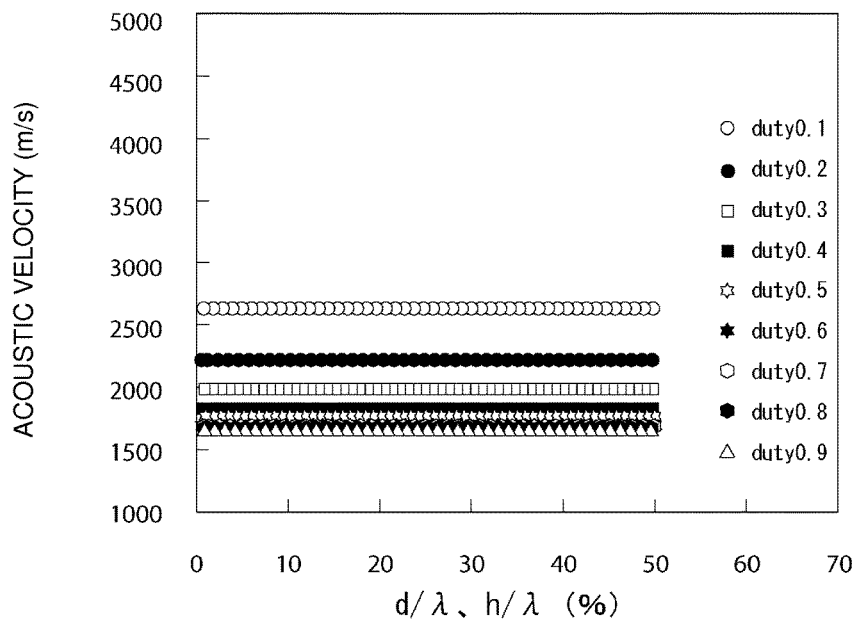
FIG. 30 shows a relationship between the thickness of the IDT electrode made of Pt and the piezoelectric substrate, the duty, and the acoustic velocity in a preferred embodiment of the present invention.

In another non-limiting example of a preferred embodiment of the present invention, the IDT electrode 7 was made of Pt. The other points were the same as those of the preferred embodiment described above. FIGS. 29 and 30 show relationships between the thickness d/λ of the piezoelectric substrate 6=the electrode thickness h/λ, the duty, the fractional bandwidth, and the acoustic velocity in an elastic wave device configured in the same manner as the preferred embodiment described above, except that the IDT electrode 7 is made of Pt.

As can be seen in FIGS. 29 and 30, even when the IDT electrode is made of Pt, the fractional bandwidth and the acoustic velocity change very little with changes in the thickness d/λ of the piezoelectric substrate 6 and the electrode thickness h/λ.

Figure 34:
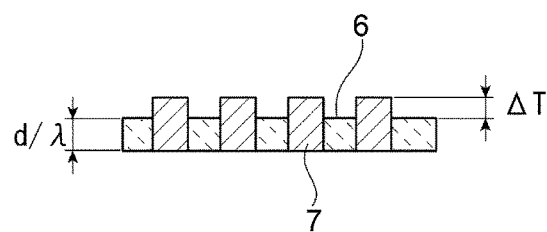
FIG. 34 is a schematic cross-sectional view illustrating a structure in which the IDT electrode protrudes above an upper surface of the piezoelectric substrate and the amount of protrusion.
Figure 35:
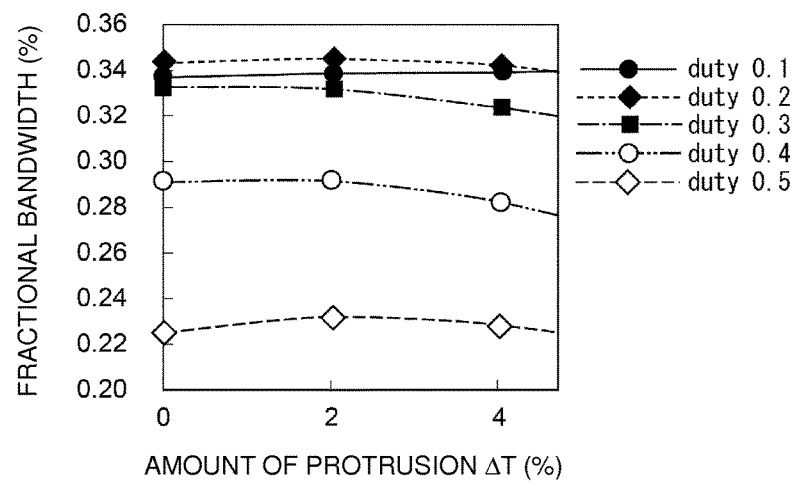
FIG. 35 shows a relationship between the amount of protrusion of the IDT electrode, the fractional bandwidth, and the duty.

Although the thickness of the piezoelectric substrate is the same as the electrode thickness (d/λ=h/λ) in the preferred embodiments described above, the present invention is not limited to this. FIG. 34 illustrates a structure in which the IDT electrode 7 protrudes above the piezoelectric substrate 6. FIG. 35 shows a relationship between the amount of protrusion ΔT (%) in FIG. 34 and the fractional bandwidth (%) when the duty is about 0.1 to about 0.5. As can be seen in FIG. 35, when the amount of protrusion ΔT (%) is small, the fractional bandwidth changes very little, as in the case of d/λ=h/λ.

Figure 36:
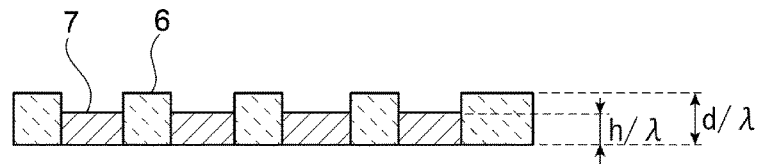
FIG. 36 is a schematic cross-sectional view illustrating a structure in which the thickness h/λ of the IDT electrode is smaller than the thickness d/λ of the piezoelectric substrate.
Figure 37:
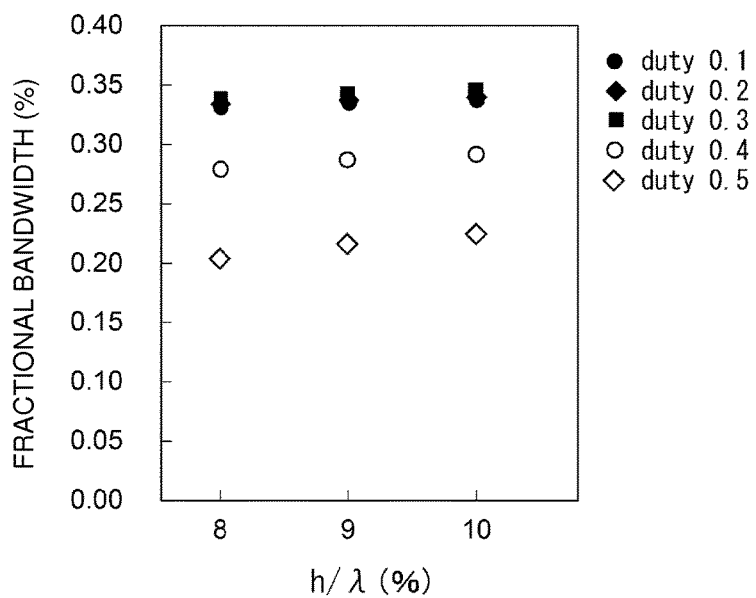
FIG. 37 shows a relationship between the duty, the thickness h/λ (%) of the IDT electrode, and the fractional bandwidth (%) when d/λ is 10%.

FIG. 36 illustrates a structure in which the thickness h/λ of the IDT electrode 7 is smaller than the thickness d/λ of the piezoelectric substrate 6. FIG. 37 shows how the fractional bandwidth changes with changes in h/λ when the duty is about 0.1 to about 0.5 and d/λ is about 10%, for example. As can be seen in FIG. 37, even when the thickness h/λ of the IDT electrode 7 is slightly smaller than the thickness d/λ of the piezoelectric substrate 6, the fractional bandwidth does not change significantly. As can be seen in FIGS. 35 and 37, the thickness of the piezoelectric substrate 6 does not necessarily need to be the same as that of the IDT electrode 7.

A method for manufacturing the elastic wave device 1 is not limited to any particular one, but the manufacturing method illustrated in FIGS. 31A to 33C can be suitably used to form the structure having the concave portion 5a.

Figure 31A:
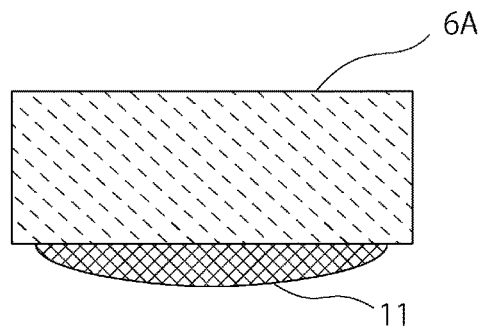
FIG. 31A to FIG. 31C are schematic front cross-sectional views illustrating a method for manufacturing an elastic wave device according to a preferred embodiment of the present invention.

First, as illustrated in FIG. 31A, a sacrificial layer 11 is formed on a lower surface of a LiNbO$_3$ substrate 6A. The sacrificial layer 11 can be made of an appropriate material, such as ZnO, that can be removed by etching.

Figure 31B:
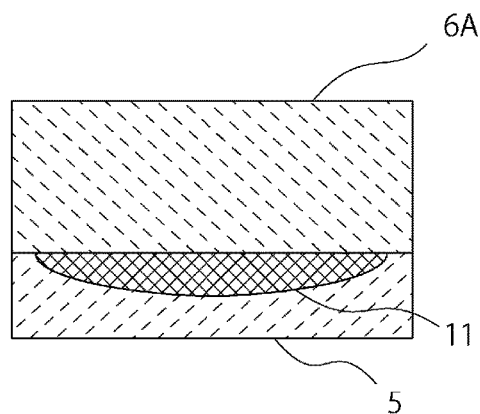

Next, as illustrated in FIG. 31B, the supporting layer 5 is formed to cover the sacrificial layer 11. An oxide film, such as a silicon oxide film, can be used as the supporting layer 5.

Figure 31C:
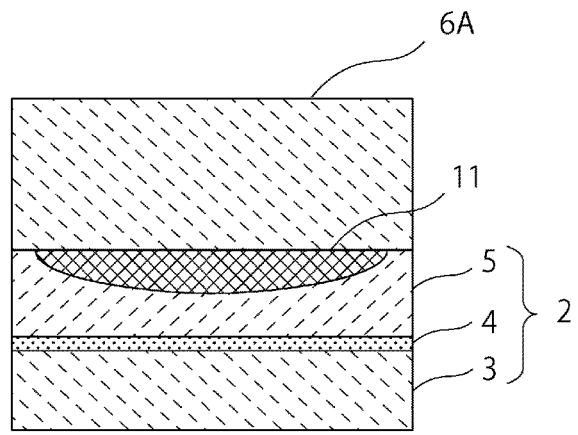

Next, as illustrated in FIG. 31C, the base substrate 3 is joined to a lower surface of the supporting layer 5, with the adhesive layer 4 interposed therebetween. Alternatively, the base substrate 3 may be directly joined to the supporting layer 5 without using the adhesive layer 4. The base substrate 3 can be made of an appropriate insulating material, such as Si.

Figure 32A:
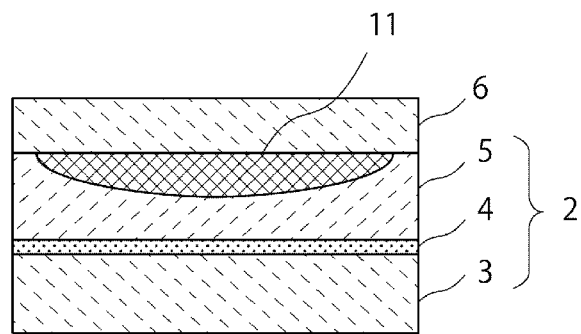
FIG. 32A to FIG. 32C are schematic front cross-sectional views also illustrating the method for manufacturing the elastic wave device according to a preferred embodiment of the present invention.
Figure 32B:
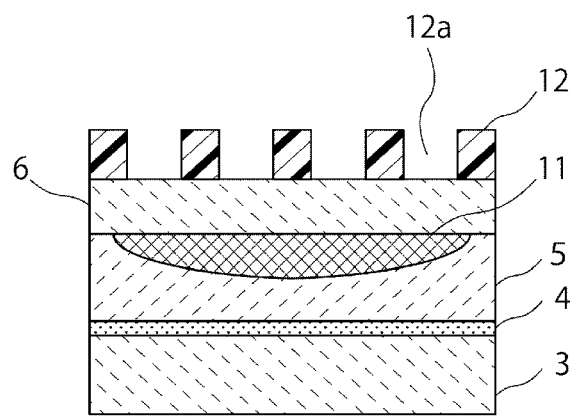

Next, as illustrated in FIG. 32A, the LiNbO$_3$ substrate 6A is polished to form the piezoelectric substrate 6. Then, as illustrated in FIG. 32B, a resist is formed on the piezoelectric substrate 6 and patterned. A resist pattern 12 is thus obtained. The resist pattern 12 has openings 12a corresponding to portions where an IDT electrode is to be formed.

Figure 32C:
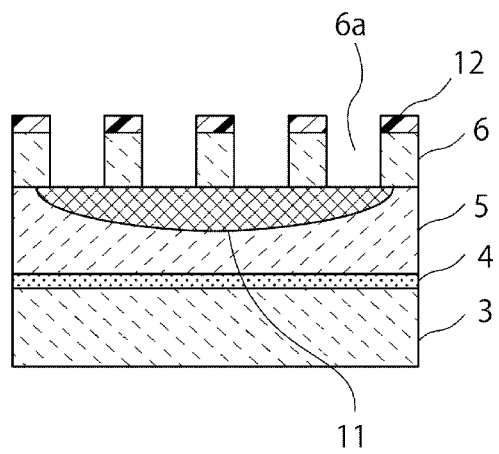

Next, as illustrated in FIG. 32C, the piezoelectric substrate 6 is patterned by etching. The through holes 6a are thus formed.

Figure 33A:
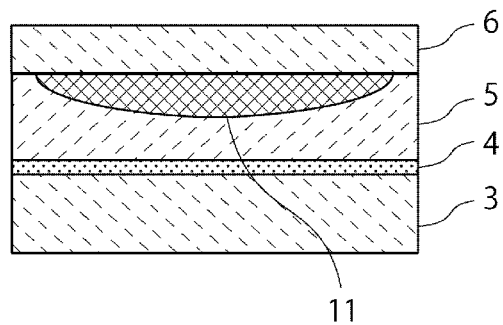
FIG. 33A to FIG. 33C are schematic front cross-sectional views also illustrating the method for manufacturing the elastic wave device according to a preferred embodiment of the present invention.
Figure 33B:
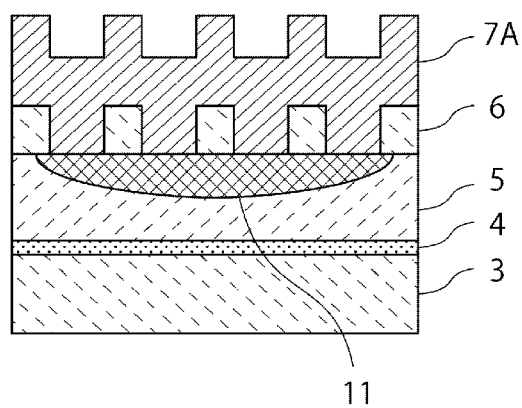
Figure 33C:
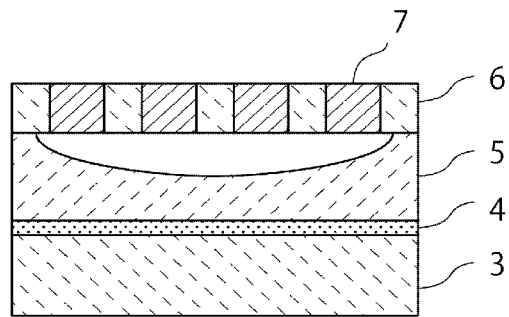

Then, as illustrated in FIG. 33A, the remaining resist pattern 12 is removed. Next, as illustrated in FIG. 33B, metal is deposited by sputtering or the like. A metal film 7a is thus formed. Then, the metal film 7a is polished by a polishing technique, such as CMP, such that the upper surface of the piezoelectric substrate 6 is flush with the upper surface of the IDT electrode 7. The structure illustrated in FIG. 33C is thus obtained. Then, the sacrificial layer 11 is removed by etching. The elastic wave device 1 illustrated in FIG. 1 is thus obtained.

The method for manufacturing the elastic wave device 1 is not limited to the manufacturing method described above. Also, the structure for acoustically isolating the piezoelectric substrate from the supporting substrate is not limited to that described above.

Although a one-port elastic wave resonator has been described in the preferred embodiments, the present invention is applicable not only to one-port elastic wave resonators, but also to various elastic wave resonators and elastic wave filters using a plate wave.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate with a thickness equal to or less than a wavelength of a propagating elastic wave; and
   an interdigital transducer electrode extending from an upper surface of the piezoelectric substrate to a lower surface of the piezoelectric substrate, in a direction of the thickness of the piezoelectric substrate.

2. The elastic wave device according to claim 1, wherein the piezoelectric substrate is made of $LiNbO_3$.

3. The elastic wave device according to claim 1, wherein a duty of the interdigital transducer electrode is about 0.5 or less.

4. The elastic wave device according to claim 2, wherein an Euler angle $\theta$ of the $LiNbO_3$ is about 100° to about 140°.

5. The elastic wave device according to claim 1, wherein the interdigital transducer electrode is made primarily of a metal selected from a group consisting of Al, Cu, W, Au, Pt, Ta, Mo, and Ni.

6. The elastic wave device according to claim 1, wherein a thickness of the interdigital transducer electrode is the same or substantially the same as the thickness of the piezoelectric substrate.

7. The elastic wave device according to claim 6, wherein the piezoelectric substrate and the interdigital transducer electrode are integral with one another.

8. The elastic wave device according to claim 1, wherein
the piezoelectric substrate includes at least one through hole extending from the upper surface of the piezoelectric substrate to the lower surface of the piezoelectric substrate;
the interdigital transducer electrode is defined by a metal material; and
the metal material of the interdigital transducer electrode is located inside of the at least one through hole.

* * * * *